United States Patent
Yun et al.

(10) Patent No.: US 9,876,513 B2
(45) Date of Patent: Jan. 23, 2018

(54) LC FILTER LAYER STACKING BY LAYER TRANSFER TO MAKE 3D MULTIPLEXER STRUCTURES

(71) Applicant: QUALCOMM Incorporated, San Diego, CA (US)

(72) Inventors: Changhan Hobie Yun, San Diego, CA (US); David Francis Berdy, San Diego, CA (US); Chengjie Zuo, San Diego, CA (US); Daeik Daniel Kim, Del Mar, CA (US); Mario Francisco Velez, San Diego, CA (US); Niranjan Sunil Mudakatte, San Diego, CA (US); Robert Paul Mikulka, Oceanside, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/088,019

(22) Filed: Mar. 31, 2016

(65) Prior Publication Data
US 2017/0288707 A1    Oct. 5, 2017

(51) Int. Cl.
*H04B 1/00* (2006.01)
*H03H 7/01* (2006.01)
*H03H 3/00* (2006.01)

(52) U.S. Cl.
CPC .............. *H04B 1/0057* (2013.01); *H03H 3/00* (2013.01); *H03H 7/0115* (2013.01)

(58) Field of Classification Search
CPC ....... H04B 1/0057; H03H 7/0115; H03H 3/00
See application file for complete search history.

(56) References Cited

U.S. PATENT DOCUMENTS

| 6,784,762 B2 | 8/2004 | Kato |
| 6,927,648 B2 | 8/2005 | Furuya et al. |
| 8,519,815 B1 | 8/2013 | Sanders |
| 2002/0196101 A1 | 12/2002 | Tsujiguchi |
| 2005/0029632 A1* | 2/2005 | McKinzie, III ........... H01P 1/16 257/665 |
| 2011/0279198 A1* | 11/2011 | Haner ................. H01F 17/0006 29/602.1 |
| 2013/0106998 A1* | 5/2013 | Pahalawatta ....... H04N 13/0029 348/43 |

(Continued)

FOREIGN PATENT DOCUMENTS

| JP | 2010154138 A | 7/2010 |
| JP | 2011147090 A | 7/2011 |

(Continued)

OTHER PUBLICATIONS

International Search Report and Written Opinion—PCT/US2017/014701—ISA/EPO—Apr. 11, 2017.

*Primary Examiner* — Mohammad Anwar
(74) *Attorney, Agent, or Firm* — Qualcomm Incorporated/Seyfarth

(57) ABSTRACT

A three dimensional (3D) multiplexer structure may include a first two dimensional (2D) inductor capacitor (LC) filter layer. The first 2D LC filter layer may include a first 2D spiral inductor and a first capacitor(s). The 3D multiplexer structure may also include a second 2D LC filter layer. The second 2D LC filter layer may include a second 2D spiral inductor and a second capacitor(s) stacked directly on and communicably coupled to the first 2D LC filter.

24 Claims, 12 Drawing Sheets

(56) References Cited

U.S. PATENT DOCUMENTS

| | | |
|---|---|---|
| 2014/0354372 A1 | 12/2014 | Zuo et al. |
| 2015/0116163 A1* | 4/2015 | Caimi ............... H01Q 5/22 343/703 |
| 2015/0228416 A1* | 8/2015 | Hurwitz ............ H01G 17/00 361/763 |
| 2015/0304059 A1 | 10/2015 | Zuo et al. |
| 2017/0093365 A1* | 3/2017 | Xu .................... H03H 7/46 |

FOREIGN PATENT DOCUMENTS

| | | |
|---|---|---|
| KR | 20110107086 A | 9/2011 |
| WO | 2005084090 A1 | 9/2005 |

* cited by examiner

US 9,876,513 B2

LC FILTER LAYER STACKING BY LAYER TRANSFER TO MAKE 3D MULTIPLEXER STRUCTURES

TECHNICAL FIELD

The present disclosure generally relates to integrated circuits (ICs). More specifically, the present disclosure relates to inductor capacitor (LC) filter layer stacking using a layer transfer process for three dimensional (3D) multiplexer designs using different process technologies.

BACKGROUND

For wireless communication, a diplexer can help process signals carried in a carrier aggregation system. In carrier aggregation systems, signals are communicated with both high band and low band frequencies. In a chipset, the diplexer is usually inserted between an antenna and a tuner (or a radio frequency (RF) switch) to ensure high performance. Usually, a diplexer design includes inductors and capacitors. Diplexers can attain high performance by using inductors and capacitors that have a high quality (Q)-factor. Higher performance of diplexers can also be attained by reducing the electromagnetic coupling between components, which may be achieved through an arrangement of the geometry and direction of the components. Diplexer performance may be quantified by measuring the insertion loss and rejection (e.g., quantities expressed in decibels (dB)) at certain frequencies.

The diplexer fabrication process may be compatible with standard semiconductor processes, such as processes for fabricating voltage-controlled capacitors (varactors), switched-array capacitors, or other like capacitors. It may be beneficial to fabricate the components of the diplexer design on a single substrate. Fabrication on a single substrate may also enable tunable diplexers that are tuned through a variety of different parameters.

Fabricating high performance diplexers in an efficient and cost-effective manner is problematic. Increasing the Q-factor of the inductors and the capacitors in the diplexer is also an issue. Reducing the electromagnetic coupling between the various components in the diplexer, while decreasing the size of the diplexer and making the most economical use of resources, would be beneficial.

SUMMARY

A three dimensional (3D) multiplexer structure may include a first two dimensional (2D) inductor capacitor (LC) filter layer. The first 2D LC filter layer may include a first 2D spiral inductor and a first capacitor(s). The 3D multiplexer structure may also include a second 2D LC filter layer. The second 2D LC filter layer may include a second 2D spiral inductor and a second capacitor(s) stacked directly on and communicably coupled to the first 2D LC filter.

A method of constructing a three dimensional (3D) multiplexer structure may include fabricating a first two dimensional (2D) inductor capacitor (LC) filter layer. The first 2D LC filter layer may include a first 2D spiral inductor and a first capacitor(s) on a substrate. The method also includes fabricating a second LC filter layer. The second 2D LC filter layer may include a second 2D spiral inductor and a second capacitor(s) on the substrate. The method further includes removing the substrate from the first 2D LC filter layer and the second 2D LC filter layer. The method also includes stacking the second 2D LC filter directly on the first 2D LC filter.

A three dimensional (3D) multiplexer structure may include a first two dimensional (2D) inductor capacitor (LC) filter layer. The first 2D LC filter layer may include a first 2D spiral inductor and a first means for storing charge. The 3D multiplexer structure may also include a second 2D LC filter layer. The second 2D LC filter layer may include a second 2D spiral inductor and a second means for storing charge stacked directly on and communicably coupled to the first 2D LC filter.

A radio frequency (RF) front end module may include a three dimensional (3D) multiplexer structure. The 3D multiplexer structure may include a first two dimensional (2D) inductor capacitor (LC) filter layer. The first 2D LC filter may include a first 2D spiral inductor and a first capacitor(s). The 3D multiplexer structure may also include a second 2D LC filter layer. The second 2D LC filter layer may include a second 2D spiral inductor and a second capacitor(s) stacked directly on and communicably coupled to the first 2D LC filter. The 3D multiplexer structure may further include an antenna coupled to an output of the 3D multiplexer structure.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1A:
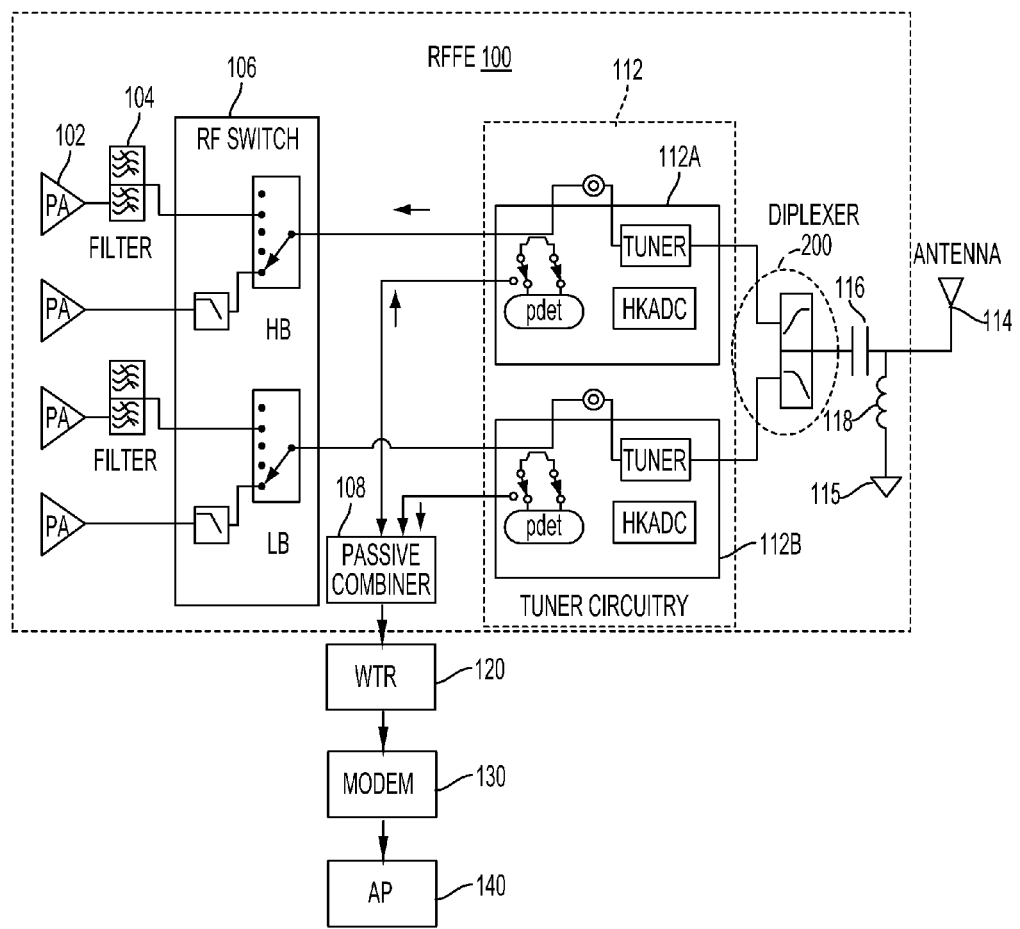
FIG. 1A is a schematic diagram of a radio frequency (RF) front end (RFFE) module employing a diplexer according to an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as carrier aggregation. Further design challenges for mobile RF transceivers include analog/RF performance considerations, including mismatch, noise and other performance considerations. The design of these mobile RF transceivers includes the use of passive devices, for example, to suppress resonance, and/or to perform filtering, bypassing and coupling.

Successful fabrication of modern semiconductor chip products involves interplay between the materials and the processes employed. In particular, the formation of conductive material plating for the semiconductor fabrication in the back-end-of-line (BEOL) processes is an increasingly challenging part of the process flow. This is particularly true in terms of maintaining a small feature size. The same challenge of maintaining a small feature size also applies to passive on glass (POG) technology, where high performance components such as inductors and capacitors are built upon a highly insulative substrate that may also have a very low loss.

Passive on glass devices involve high performance inductor and capacitor components that have a variety of advantages over other technologies, such as surface mount technology or multi-layer ceramic chips. These advantages include being more compact in size and having smaller manufacturing variations. Passive on glass devices also involve a higher quality (Q)-factor value that meets stringent low insertion loss and low power consumption specifications. Devices such as inductors and capacitors may be implemented with passive on glass technologies.

An inductor is an example of an electrical device used to temporarily store energy in a magnetic field within a wire coil according to an inductance value. This inductance value provides a measure of the ratio of voltage to the rate of change of current passing through the inductor. Energy is temporarily stored in the coil, as a magnetic field, when the current flowing through the inductor changes. In addition to their magnetic field storing capability, inductors are often used in alternating current (AC) electronic equipment, such as radio equipment. For example, the design of mobile RF transceivers includes the use of inductors with improved inductance density while reducing magnetic loss at high frequency.

Various aspects of the disclosure provide techniques for fabrication of multiplexers using two dimensional (2D) passive on glass (POG) stacked filters using a layer transfer process. The process flow for semiconductor fabrication of the multiplexer structure may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably unless such interchanging would tax credulity.

As described herein, the back-end-of-line interconnect layers may refer to the conductive interconnect layers (e.g., metal one (M1), metal two (M2), metal three (M3), etc.) for electrically coupling to front-end-of-line active devices of an integrated circuit. The back-end-of-line interconnect layers may electrically couple to middle-of-line interconnect layers for, for example, connecting M1 to an oxide diffusion (OD) layer of an integrated circuit. A back-end-of-line first via (V2) may connect M2 to M3 or others of the back-end-of-line interconnect layers.

Aspects of the present disclosure describe 3D multiplexer structures using stacked 2D filters for high quality (Q)-factor radio frequency (RF) applications. In one arrangement, a 3D multiplexer structure includes a first 2D inductance capacitance (LC) filter on a passive substrate. The first 2D LC filter includes a first 2D spiral inductor and a first capacitor(s). The 3D multiplexer structure also includes a second 2D LC filter. The second 2D LC filter includes a second 2D spiral inductor and a second capacitor(s). In one aspect of the present disclosure, the first LC filter and the second LC filter are formed without a substrate to provide the 3D multiplexer structure using a layer transfer process.

FIG. 1A is a schematic diagram of a radio frequency (RF) front end (RFFE) module 100 employing a diplexer 200 according to an aspect of the present disclosure. The RF front end module 100 includes power amplifiers 102, duplexer/filters 104, and a radio frequency (RF) switch module 106. The power amplifiers 102 amplify signal(s) to a certain power level for transmission. The duplexer/filters 104 may filter the input/output signals according to a variety of different parameters, including frequency, insertion loss, rejection or other like parameters. In addition, the RF switch module 106 may select certain portions of the input signals to pass on to the rest of the RF front end module 100.

The RF front end module 100 also includes tuner circuitry 112 (e.g., first tuner circuitry 112A and second tuner circuitry 112B), the diplexer 200, a capacitor 116, an inductor 118, a ground terminal 115 and an antenna 114. The tuner circuitry 112 (e.g., the first tuner circuitry 112A and the second tuner circuitry 112B) includes components such as a tuner, a portable data entry terminal (PDET), and a house keeping analog to digital converter (HKADC). The tuner circuitry 112 may perform impedance tuning (e.g., a voltage standing wave ratio (VSWR) optimization) for the antenna 114. The RF front end module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1A, the diplexer 200 is between the tuner component of the tuner circuitry 112 and the capacitor 116, the inductor 118, and the antenna 114. The diplexer 200 may be placed between the antenna 114 and the tuner circuitry 112 to provide high system performance from the RF front end module 100 to a chipset including the wireless transceiver 120, the modem 130 and the application processor 140. The diplexer 200 also performs frequency domain multiplexing on both high band frequencies and low band frequencies. After the diplexer 200 performs its frequency multiplexing functions on the input signals, the output of the diplexer 200 is fed to an optional LC (inductor/capacitor) network including the capacitor 116 and the inductor 118. The LC network may provide extra impedance matching components for the antenna 114, when desired. Then a signal with the particular frequency is transmitted or received by the antenna 114. Although a single capacitor and inductor are shown, multiple components are also contemplated.

Figure 1B:
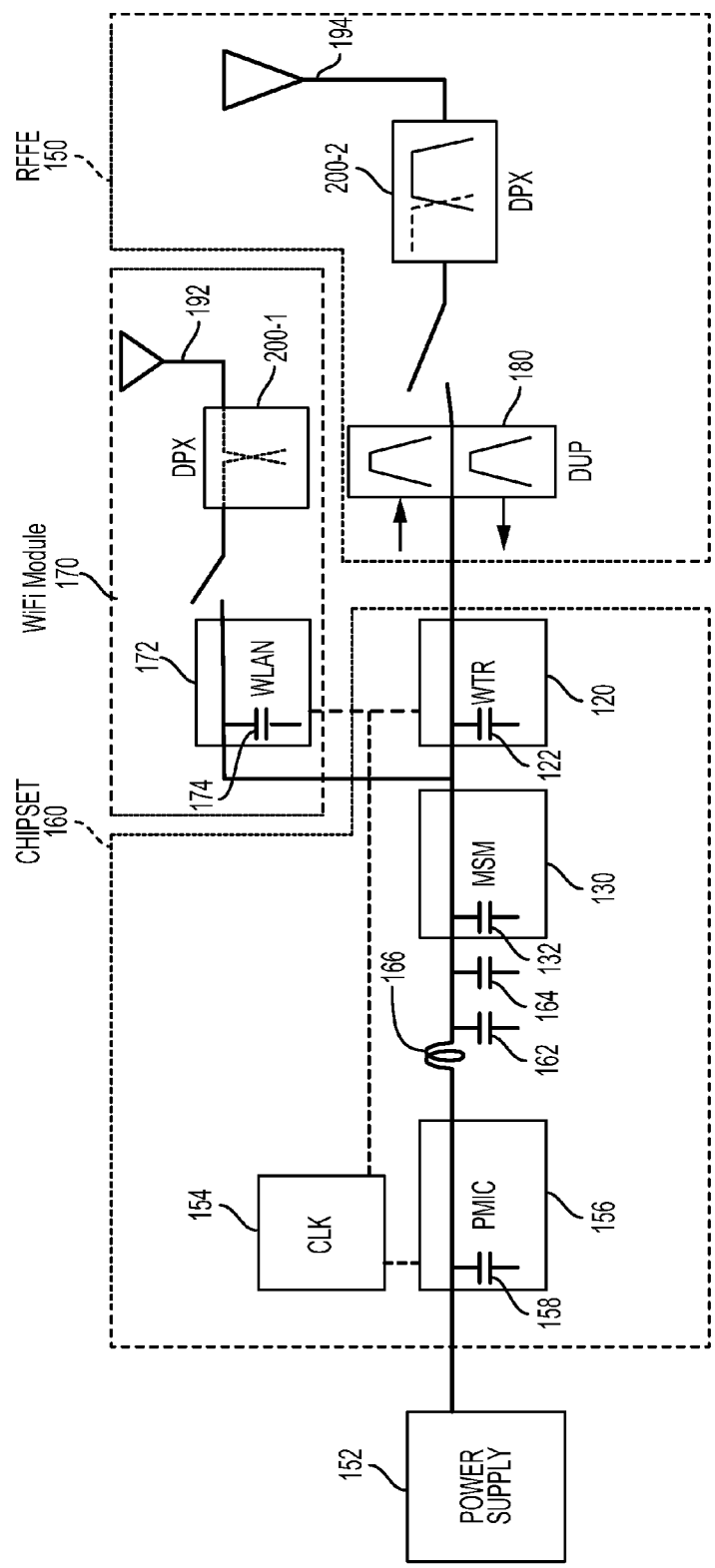
FIG. 1B is a schematic diagram of a radio frequency (RF) front end (RFFE) module employing diplexers for a chipset to provide carrier aggregation according to aspects of the present disclosure.

FIG. 1B is a schematic diagram of a WiFi module 170 including a first diplexer 200-1 and an RF front end module 150 including a second diplexer 200-2 for a chipset 160 to provide carrier aggregation according to an aspect of the present disclosure. The WiFi module 170 includes the first diplexer 200-1 communicably coupling an antenna 192 to a wireless local area network module (e.g., WLAN module 172). The RF front end module 150 includes the second diplexer 200-2 communicably coupling an antenna 194 to the wireless transceiver (WTR) 120 through a duplexer 180. The wireless transceiver 120 and the WLAN module 172 of the WiFi module 170 are coupled to a modem (MSM, e.g., baseband modem) 130 that is powered by a power supply 152 through a power management integrated circuit (PMIC) 156. The chipset 160 also includes capacitors 162 and 164, as well as an inductor(s) 166 to provide signal integrity. The PMIC 156, the modem 130, the wireless transceiver 120, and the WLAN module 172 each include capacitors (e.g., 158, 132, 122, and 174) and operate according to a clock 154. The geometry and arrangement of the various inductor and capacitor components in the chipset 160 may reduce the electromagnetic coupling between the components.

Figure 2A:
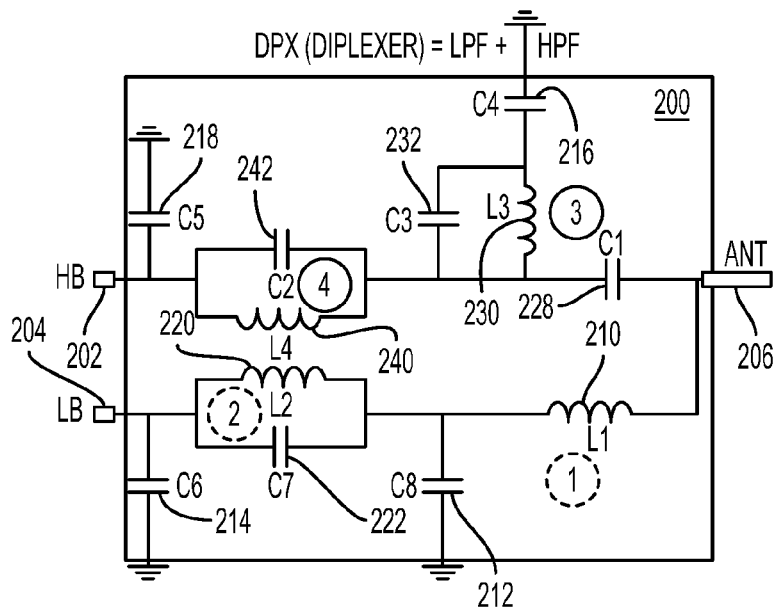
FIG. 2A is a schematic diagram of a diplexer design according to an aspect of the present disclosure.

FIG. 2A is a schematic diagram of a diplexer 200 according to an aspect of the present disclosure. The diplexer 200 includes a high band (HB) input port 202, a low band (LB) input port 204, and an antenna 206. A high band path of the diplexer 200 includes an input capacitor 218 (C5) and a first parallel coupled capacitor 242 (C2) with a fourth inductor 240 (L4). The high band path also includes a second capacitor 216 (C4) and a second parallel coupled capacitor 232 (C3) with a third inductor 230 (L3), and an output capacitor 228 (C1). A low band path of the diplexer 200 includes an input capacitor 214 (C6) and a first parallel coupled capacitor 222 (C7) with a second inductor 220 (L2). The low band path also includes a second capacitor 212 (C8) and a first inductor 210 (L1). Operation of the diplexer 200 is controlled by the first inductor 210, the second inductor 220, the third inductor 230, and the fourth inductor 240, as shown in the graph 250 of FIG. 2B.

Figure 2B:
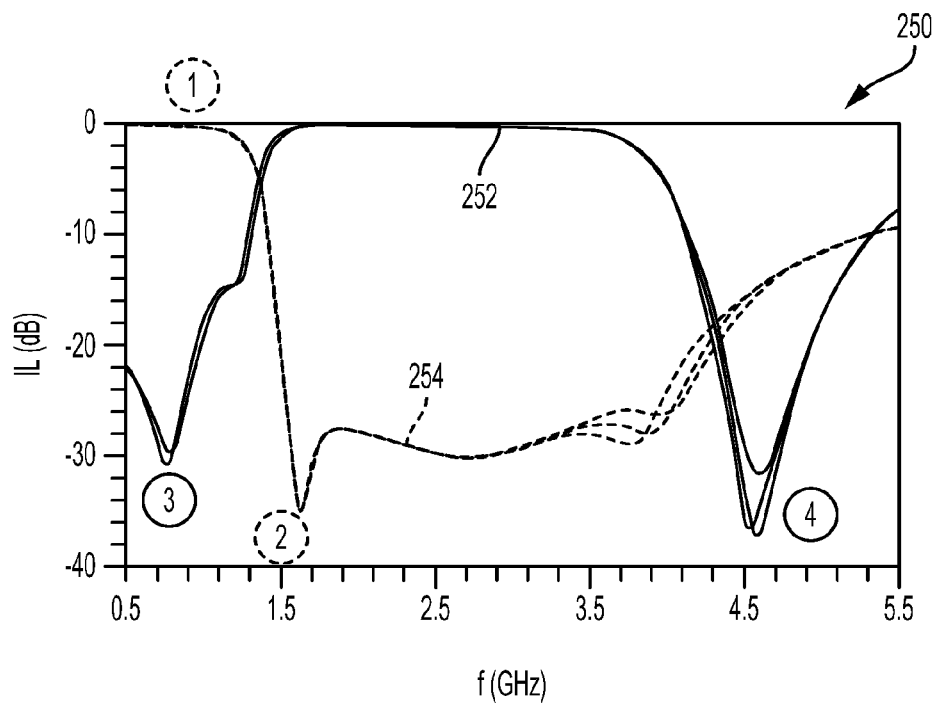
FIG. 2B is a graph illustrating performance of the diplexer design of FIG. 2A according to an aspect of the present disclosure.

FIG. 2B is a graph 250 illustrating performance of a diplexer design according to an aspect of the present disclosure. The x-axis of the graph 250 reflects the frequency in gigahertz (GHz) and the y-axis of the graph 250 reflects a decibel (dB) rating. A high pass filter curve 252 is a frequency response (transmission in dB) of the third inductor 230 (L3) and the fourth inductor 240 (L4). A low pass filter curve 254 is a frequency response (transmission in dB) of the first inductor 210 (L1) and the second inductor 220 (L2). In the diplexer configuration of FIG. 2A, an antenna pad (e.g., the antenna 206) is the output for both the high band path and the low band path, whereas the input ports (e.g., the high band input port 202 and the low band input port 204) are separate. According to the graph 250, meeting the low pass filter curve 254 may involve higher performance inductors (e.g., the first inductor 210 (L1) and the second inductor 220 (L2)) than the inductors (e.g., the third inductor 230 (L3) and the fourth inductor 240 (L4)) for meeting the high pass filter curve 252.

Figure 2C:
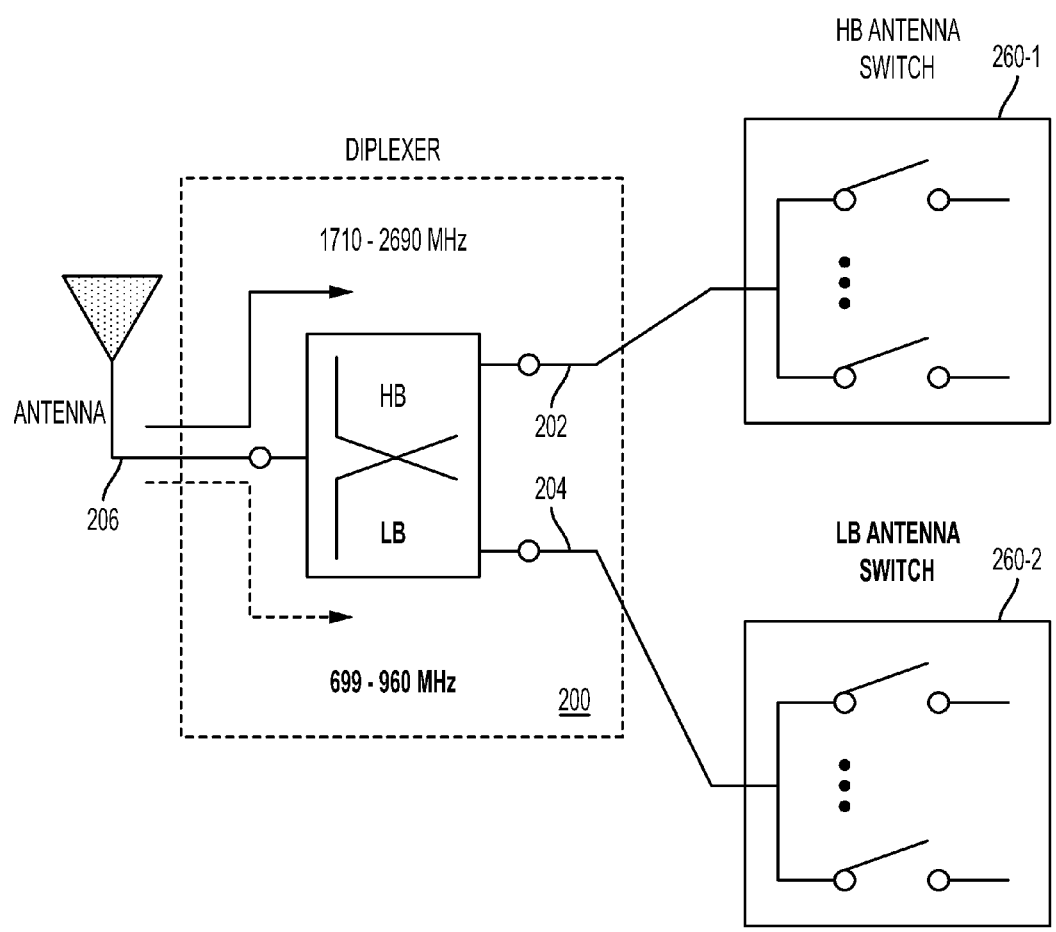
FIG. 2C is a diagram further illustrating the diplexer design of FIG. 2A according to an aspect of the present disclosure.

FIG. 2C is a diagram further illustrating the diplexer 200 of FIG. 2A according to an aspect of the present disclosure. The diplexer 200 includes a high band (HB) input port 202, a low band (LB) input port 204, and an antenna 206 coupled to an output port. A high band path of the diplexer 200 includes a high band antenna switch 260-1. A low band path of the diplexer 200 includes a low band antenna switch 260-2. A wireless device including an RF front end module may use the antenna switches 260 and the diplexer 200 to enable a wide range band for an RF input and an RF output of the wireless device. In addition, the antenna 206 may be a multiple input, multiple output (MIMO) antenna. Multiple input, multiple output antennas will be widely used for the RF front end of wireless devices to support features such as carrier aggregation.

Figure 3A:
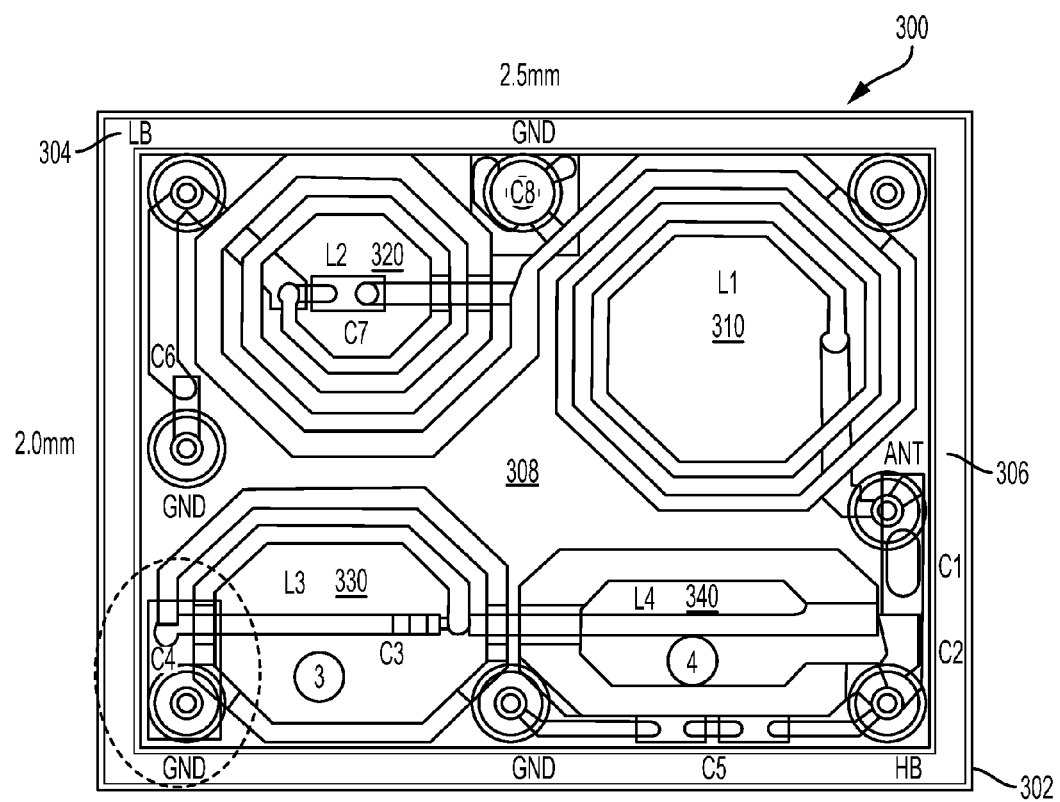
FIG. 3A is a top view of a layout of a diplexer design according to an aspect of the present disclosure.

FIG. 3A is a top view of a layout of a diplexer design 300 according to an aspect of the present disclosure. The layout of the diplexer design 300 corresponds to the schematic diagram of the diplexer 200 from FIG. 2A according to a 2D configuration. Also, the components are implemented in (or on) a passive substrate 308. As described herein, the term "passive substrate" may refer to a substrate of a diced wafer or panel, or may refer to the substrate of a wafer/panel that is not diced. In one arrangement, the passive substrate is comprised of glass, air, quartz, sapphire, high-resistivity silicon, or other like passive material. The passive substrate may be a coreless substrate.

The diplexer design 300 includes a high band (HB) input path 302, a low band (LB) input path 304, and an antenna 306. In this arrangement the first inductor 310 (L1) and the second inductor 320 (L2) are arranged using 2D spiral inductors. In addition, the third inductor 330 and the fourth inductor 340 are also arranged using 2D spiral inductors. The various capacitor (e.g., C1 to C8) are also shown and arranged according to the configuration shown in FIG. 2A.

A thickness of the 2D planar inductors may be within a range of ten (10) to thirty (30) micrometers. In addition, the footprint occupied by the diplexer design 300 may be in the range of 2 micrometers by 2.5 micrometers due to the 2D planar spiral configuration of the inductors. While this arrangement may be fabricated using less complicated designs, this arrangement consumes additional space.

Figure 3B:
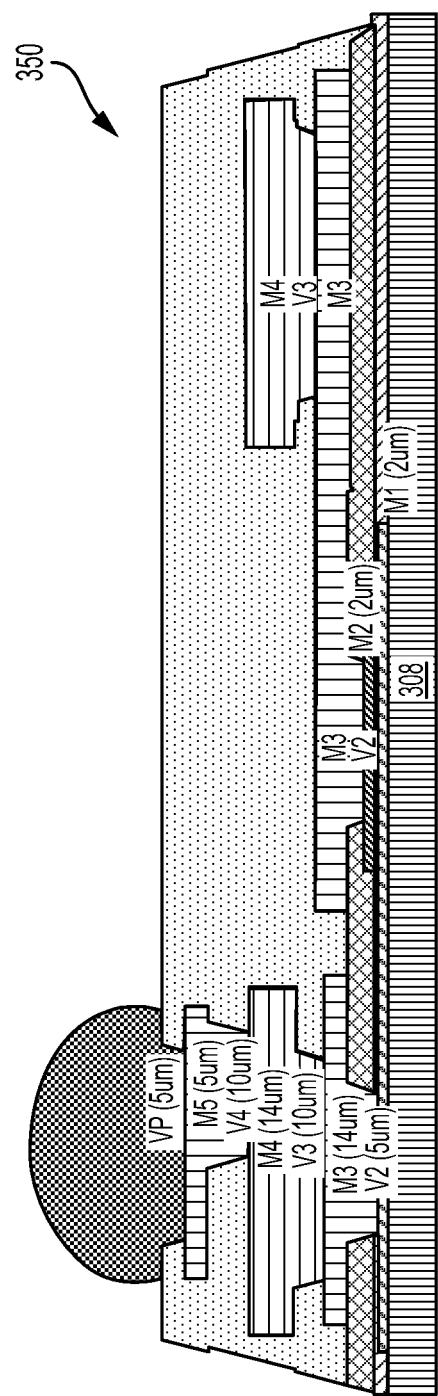
FIG. 3B shows a cross section view of the diplexer design of FIG. 3A according to aspects of the present disclosure.

FIG. 3B shows a cross section view 350 of the diplexer design 300 of FIG. 3A according to aspects of the present disclosure. For purposes of illustration, various interconnect layers and vias are supported by a passive substrate 308 and may be arranged as the inductors L1 320, L2 320 and capacitors C6 and C7 to form a low band filter of the diplexer design 300.

In the depicted configuration of FIG. 3A, the inductors (e.g., the first inductor 310 (L1), the second inductor 320 (L2), the third inductor 330 (L3), and the fourth inductor 340 (L4)) may be implemented using high performance inductors fabricated using the same high technology process. Although the diplexer design 300 of FIG. 3A may provide a desired performance level, fabrication of the diplexer design 300 is more complex and involves additional cost to implement the high performance inductors (e.g., 310, 320, 330, and 340).

According to aspects of the present disclosure, multiplexers using stacked 2D filters fabricated using different technological processes are described. In particular, because meeting the low pass filter curve 254 (FIG. 2B) may involve higher performance inductors, the first inductor 310 and the second inductor 320 may be implemented using a higher cost, high technology process. Conversely, because meeting the high pass filter curve 252 may involve lower performance inductors, the third inductor 330 (L3) and the fourth inductor 340 (L4) may be implemented using a lower cost, low technology process different from the high technology process, for example, shown in FIGS. 4A and 4B.

Figure 4A:
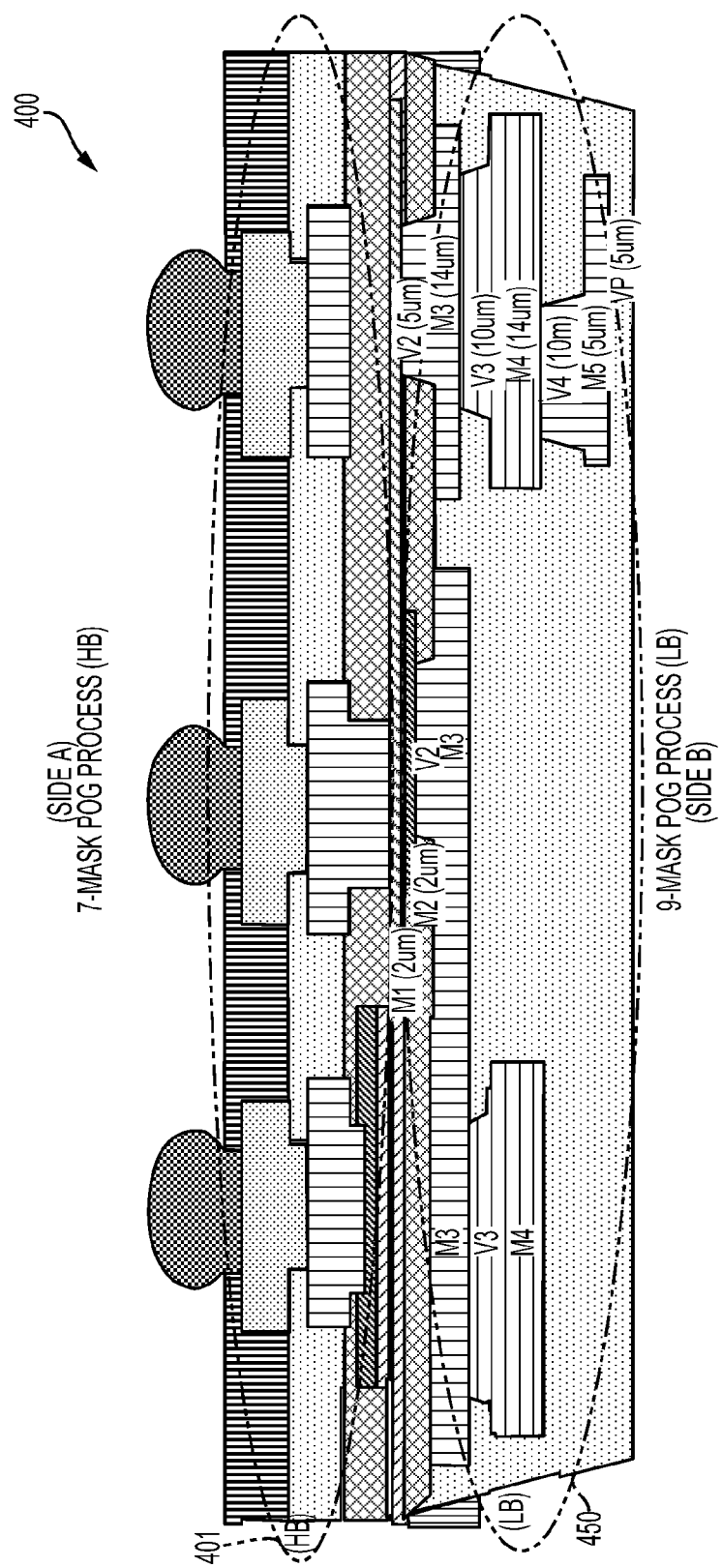
FIG. 4A illustrates a 3D multiplexer structure using a first 2D inductance capacitance (LC) filter stacked directly on a second 2D LC filter for a high quality (Q)-factor radio frequency (RF) application according to aspects of the present disclosure.

FIG. 4A illustrates a multiplexer structure 400 using a first 2D inductance capacitance (LC) filter stacked with a second 2D (LC) filter for a high quality (Q)-factor radio frequency (RF) application according to aspects of the present disclosure. In one arrangement, the first 2D LC filter 401 is configured as a high band (HB) filter, and the second 2D LC filter 450 is configured as a low band (LB) filter. In this aspect of the present disclosure, the first 2D LC filter 401 and the second 2D LC filter 450 are formed without a substrate to provide a two-sided multiplexer structure using a layer transfer process.

In this arrangement, the first 2D LC filter 401 and the second 2D LC filter 450 are initially fabricated on a passive substrate using a different technology processes. For example, the first inductor L1 and the second inductor L2 of the second 2D LC filter 450 may be high performance inductors fabricated using a thin-film high technology process (e.g., a nine-mask passive on glass (POG) process) to meet the low pass filter curve 254 (FIG. 2B). Conversely, the third inductor L3 and the fourth inductor L4 of the first 2D LC filter 401 may be low performance inductors fabricated using a thin-film low technology process (e.g., a seven-mask passive on glass process) to meet the reduced requirements of the high pass filter curve 252 (FIG. 2B).

For example, the thin-film high technology process may be a thin-film electroplating process, using upper level conductive interconnect layers and vias (e.g., M3, V3, M4, V4, and M5) to optimize fabrication of the first inductor L1 and the second inductor L2 of the second 2D LC filter 450 using conductive (e.g., copper (Cu)) traces (e.g., a copper trace). The conductive traces may be fabricated using a pure conductive material (e.g., pure copper Cu), rather than a copper paste. Conversely, the thin-film low technology process may use lower level conductive interconnect layers and vias (e.g., M1, V2, and M2) to fabricate lower performance inductors, such as the first inductor L1 and the second inductor L2 of the second 2D LC filter 450. The various thin-film processes used to fabricate the multiplexer structure 400 may use different conductive material stack and dielectric material to form the passive devices of the first 2D LC filter 401 and the second 2D LC filter 450. In addition, the various thin-film processes used to fabricate the multiplexer structure 400 may be contrasted with the build-up processes (e.g., low-temperate co-fired ceramics (LTCC)) used to fabricate surface mount (SMT) passive devices.

In one arrangement, the first 2D LC filter 401 and the second 2D LC filter 450 are fabricated side-by-side on a passive substrate. Once fabricated, the first 2D LC filter 401 and the second 2D LC filter 450 may be removed from the passive substrate using a layer transfer process and stacked onto one another as shown in FIG. 4A. Once fabricated, the first 2D LC filter 401 and the second 2D LC filter 450 may be peeled from the passive substrate using a layer transfer process. For example, the passive substrate may be removed using an etching process or a mechanical peeling process, followed by stacking of the first 2D LC filter 401 and the second 2D LC filter 450 to form the multiplexer structure 400.

Alternatively, the side-by-side fabrication of the first 2D LC filter 401 and the 2D second 2D LC filter 450 may enable a folding and back-to-back bonding lamination process. In another aspect, the first 2D LC filter 401 and the second 2D LC filter 450 may be fabricated on opposing surface of the passive substrate using a two-side printing process.

The stacking of the first 2D LC filter 401 and the second 2D LC filter 450 may be back-to-back, back-to-front, front-to-back or other like arrangement to meet the desired high pass and low pass filter specifications. In addition, stacking of the first 2D LC filter 401 and the second 2D LC filter 450 may be performed to reduce inductor coupling by arranging the capacitor areas and the inductors areas to prevent overlap following the stacking process. In one arrangement, the side B is a backside of the multiplexer structure 400 distal from a system board (e.g., a printed circuit board (PCB)) to eliminate customer specific ground plane impact.

In one aspect of the present disclosure, the passive substrate may be a diced portion of a passive substrate panel (e.g., a glass substrate panel) that supports a dual-sided printing process. The glass substrate panel may, for example, have dimensions including a twenty (20) by twenty (20) inch (20"×20") length and width, with a panel thickness in the range of three hundred (300) to four hundred (400) microns. In this arrangement, the dual-sided printing process enables the printing of conductive interconnect layers (e.g., metal A (MA), metal B (MB), metal C (MC), etc.) on a surface of the passive substrate. This dual-sided printing process also enables the printing of back-end-of-line (BEOL) interconnect layers (e.g., metal 1 (M1), metal 2 (M2), metal 3 (M3), etc.) on an opposing surface of the passive substrate.

Figure 4B:
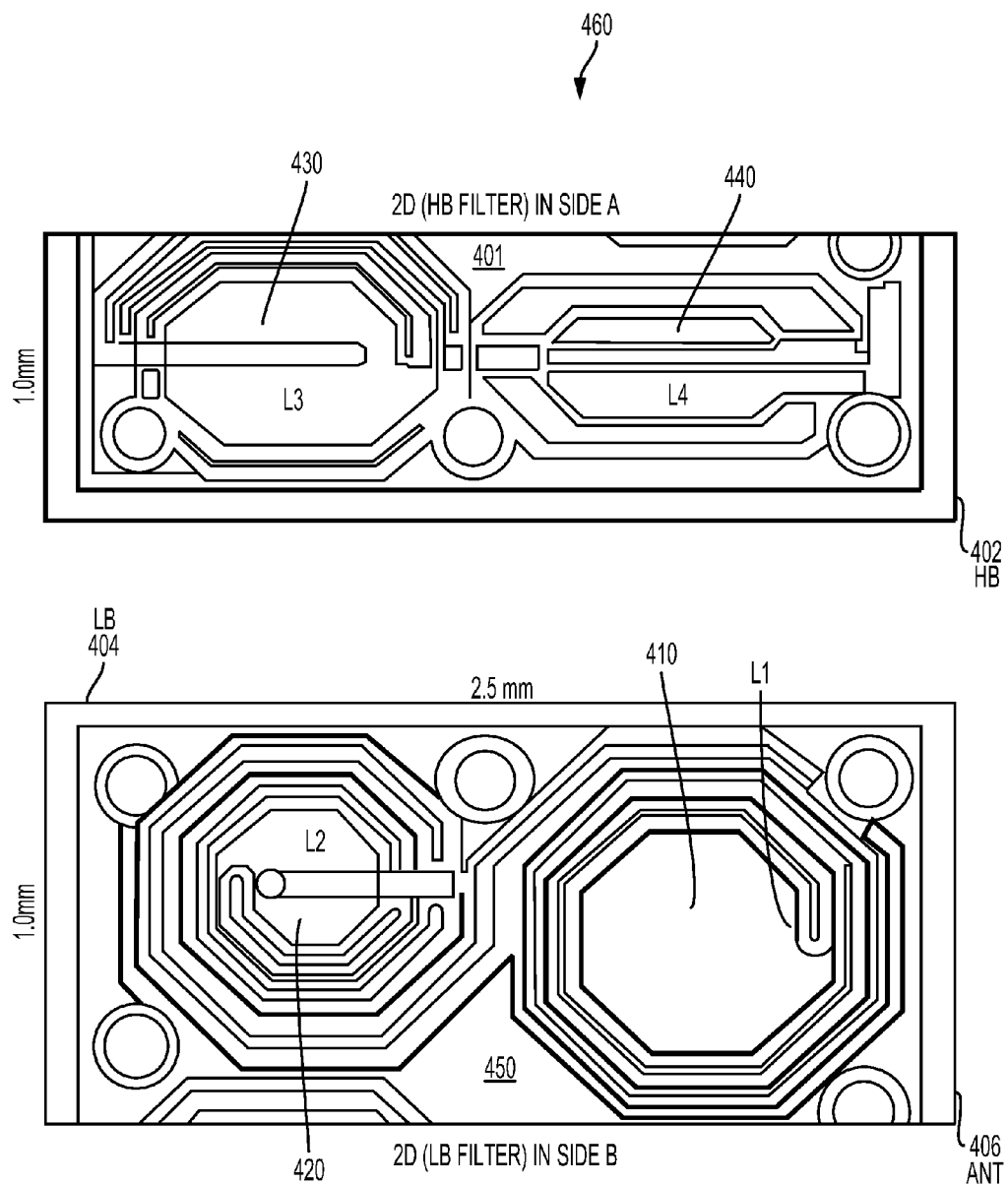
FIG. 4B illustrates a top view of components of the multiplexer structure of FIG. 4A, including the first 2D LC filter and the second 2D LC filter for high quality (Q)-factor radio frequency (RF) applications according to aspects of the present disclosure.

FIG. 4B illustrates a top view 460 of components of the multiplexer structure 400 of FIG. 4A, including the first 2D LC filter 401 and the second 2D LC filter 450 to provide high band filtering and low band filtering for high Q-factor RF applications according to aspects of the present disclosure. In this arrangement, side A of the multiplexer structure 400 includes a high band filter having the third inductor 430 (L3) and the fourth inductor 440 (L4) arranged as 2D spiral inductors within a 1 millimeter by 2.5 millimeter footprint.

In addition, side B of the multiplexer structure 400 includes a low band filter having the first inductor 410 (L1) and the second inductor 520 (L2)) also arranged as 2D spiral inductors within a 1 millimeter by 2.5 millimeter footprint.

Figure 5:
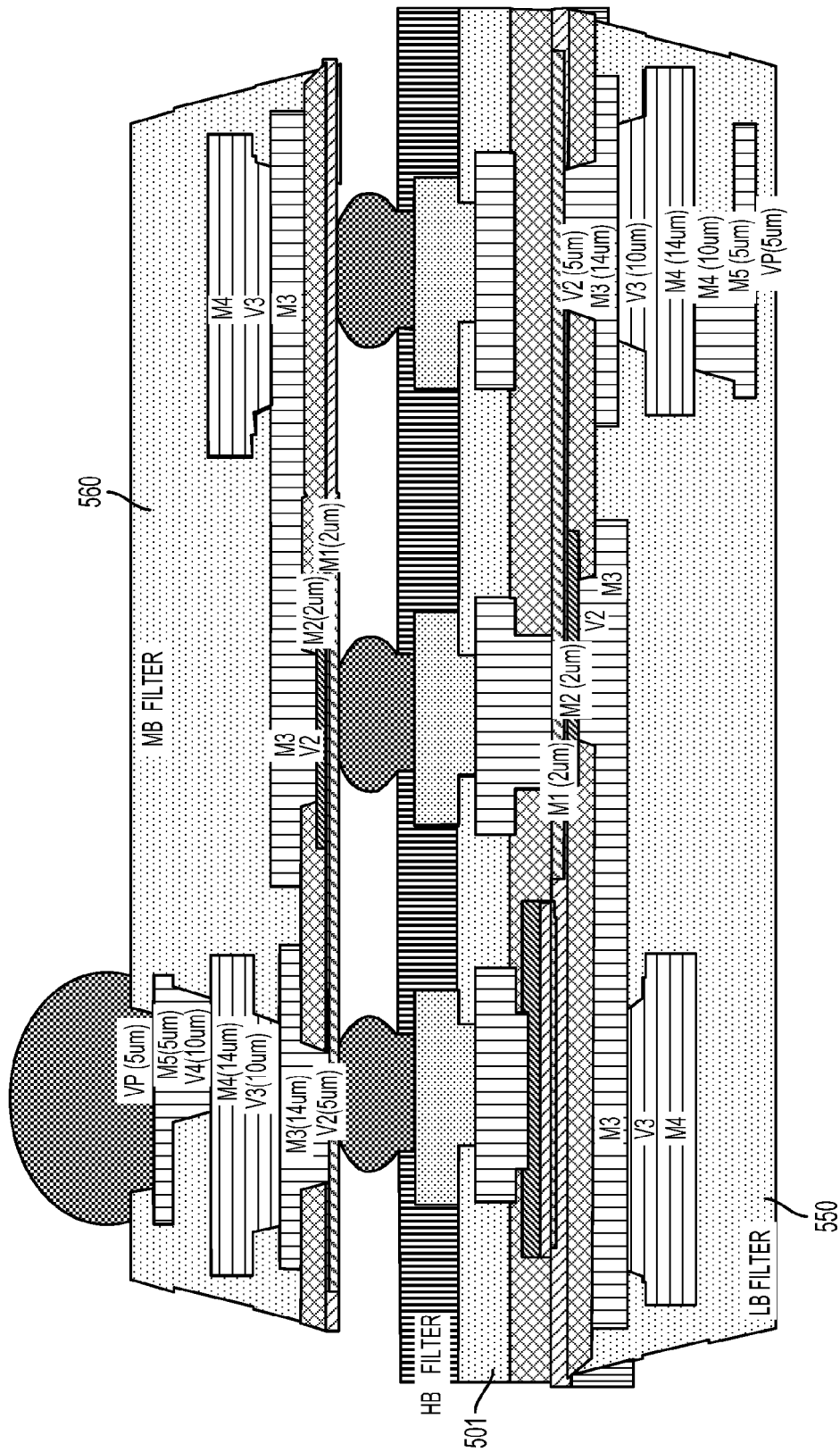
FIG. 5 illustrates a hybrid multiplexer structure using a 2D mid-band (MB) filter stacked coupled to a high band (HB) filter stacked directly on a low band (LB) filter for a high quality (Q)-factor radio frequency (RF) application according to aspects of the present disclosure.

FIG. 5 illustrates a hybrid multiplexer structure 500 using a 2D mid-band (MB) filter stacked coupled to a high band (HB) filter stacked directly on a low band (LB) filter for a high quality (Q)-factor radio frequency (RF) application according to aspects of the present disclosure. In this aspect of the present disclosure, back-to-front integration is used to couple a mid-band (MB) filter 560 to conductive bumps of a multiplexer structure including a high band (HB) filter 501 stacked directly on a low band (LB) filter 550 to provide the hybrid multiplexer structure 500. In this arrangement, integration of the mid-band filter 560 may be performed using an inter-passivation dielectric (IPD) for the high band filter 501 and passive on glass (POG) technology for the low band filter 550.

Figure 6:
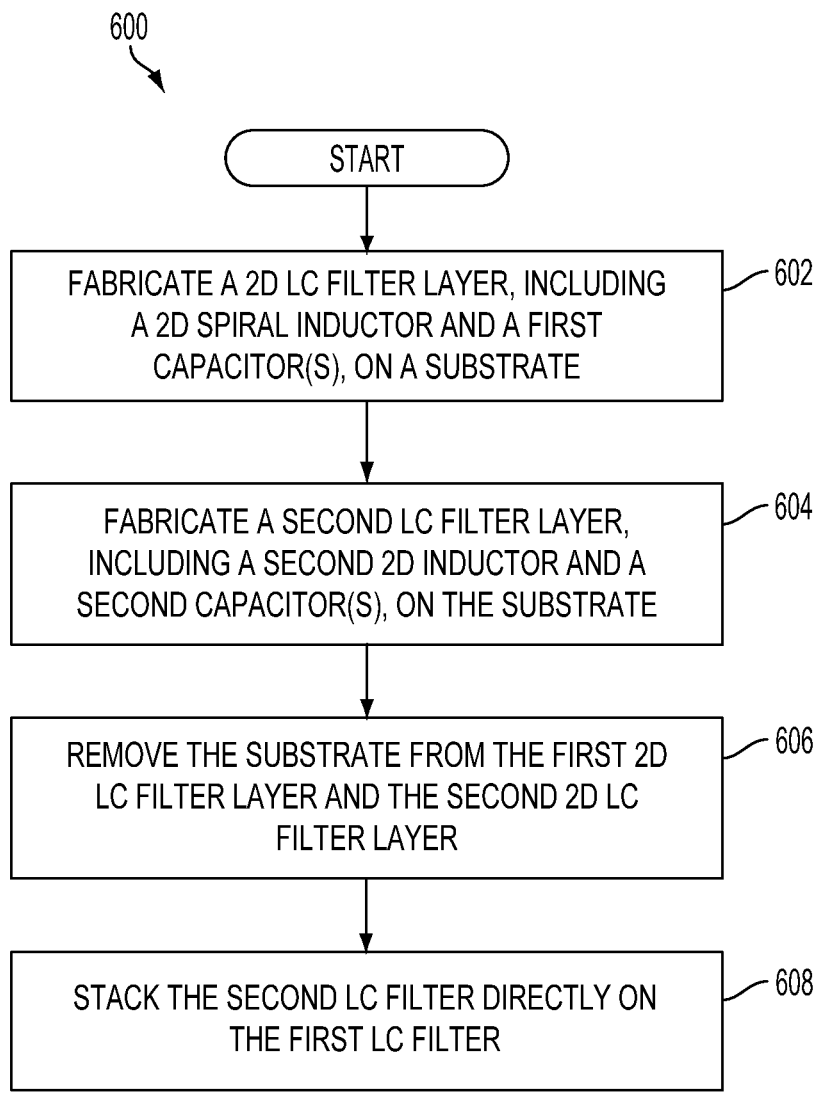
FIG. 6 is a process flow diagram illustrating a method of making a multiplexer structure according to aspects of the present disclosure.

FIG. 6 is a process flow diagram illustrating a method 600 of constructing a 3D multiplexer structure according to an aspect of the present disclosure. In block 602, a first 2D LC filter layer, including a first 2D spiral inductor and at least one first capacitor, is fabricated on a substrate. For example, as shown in FIG. 4A, the multiplexer structure 400 includes the first 2D LC filter 401, arranged as a high band filter. The high band filter may include 2D planar spiral inductor(s) (e.g., the third inductor 530 (L3) and the fourth inductor 540 (L4)). The first 2D LC filter 401 may be fabricated using a first process.

As noted above, substrate used to form the first 2D LC filter 401 may be a passive substrate panel formed by dicing a glass substrate panel along the dicing lines, which may be referred to herein as "dicing streets." The dicing lines indicate where the glass panel substrate is to be broken apart or separated into pieces. The dicing lines may define the outline of the various RF circuits that have been fabricated on the glass panel substrate. This dicing process may be performed using a stealth dicing process that involves a scribing and cracking process along the dicing street without material loss. Stealth dicing may be distinguished from the dicing of silicon, which involves material loss due to grinding of, for example, a saw blade along the dicing street.

In block 604, a second 2D LC filter layer, including a second 2D inductor and a second capacitor(s), is fabricated on the substrate. For example, as shown in FIG. 4A, the multiplexer structure 400 includes the second 2D LC filter 450 arranged as a low band filter. The low band filter may include 2D inductor(s) (e.g., the first inductor 410 (L1) and the second inductor 420 (L2)) and a first capacitor (C1). In one arrangement, the first 2D LC filter 401 and the second 2D LC filter 450 are fabricated side-by-side on a passive substrate, such as a glass substrate panel. The second 2D LC filter 450 may be fabricated using a second process different from the first process used to fabricate first 2D LC filter 401.

In block 606, the substrate is removed from the first 2D LC filter layer and the second 2D LC filter layer. As shown in FIG. 4A, the first 2D LC filter 401 and the second 2D LC filter 450 may be peeled from the passive substrate using a layer transfer process. For example, the passive substrate may be removed using an etching or mechanical peeling process. The method 600 also includes stacking the second LC filter directly on the first LC filter at block 608. For example, as shown in FIG. 4A, the layer transfer process is followed by stacking of the first 2D LC filter 401 and the second 2D LC filter 450 to form the multiplexer structure 400. According to aspects of the present disclosure, a dual-sided printing process for a glass panel substrate may be used to fabricate the first 2D LC filter 401 and the second 2D LC filter 450, followed by stacking of the filter layers to form a 3D stacked multiplexer structure, for example, as shown in FIG. 4A.

According to a further aspect of the present disclosure, a 3D multiplexer structure is described. The 3D multiplexer structure includes a first LC filter having a 2D spiral inductor a first means for storing charge. The 3D multiplexer structure also includes a second 2D LC filter layer having a second 2D spiral inductor and a second means for storing charge directly on and communicably coupled to the first 2D LC filter. The first charge storing means may be the capacitor C3, shown in FIG. 3A. The second charge storing means may be the capacitor C7, shown in FIG. 3A. In another aspect, the aforementioned means may be any module or any apparatus configured to perform the functions recited by the aforementioned means.

Aspects of the present disclosure describe 3D multiplexer structures using stacked 2D filters for high quality (Q)-factor radio frequency (RF) applications. In one arrangement, a 3D multiplexer structure includes a first 2D inductance capacitance (LC) filter on a passive substrate. The first 2D LC filter includes a first 2D spiral inductor and a first capacitor(s). The 3D multiplexer structure also includes a second 2D LC filter. The second 2D LC filter includes a second 2D spiral inductor and a second capacitor(s). In one aspect of the present disclosure, the first LC filter and the second LC filter are formed without a substrate to provide the 3D multiplexer structure using a layer transfer process.

Figure 7:
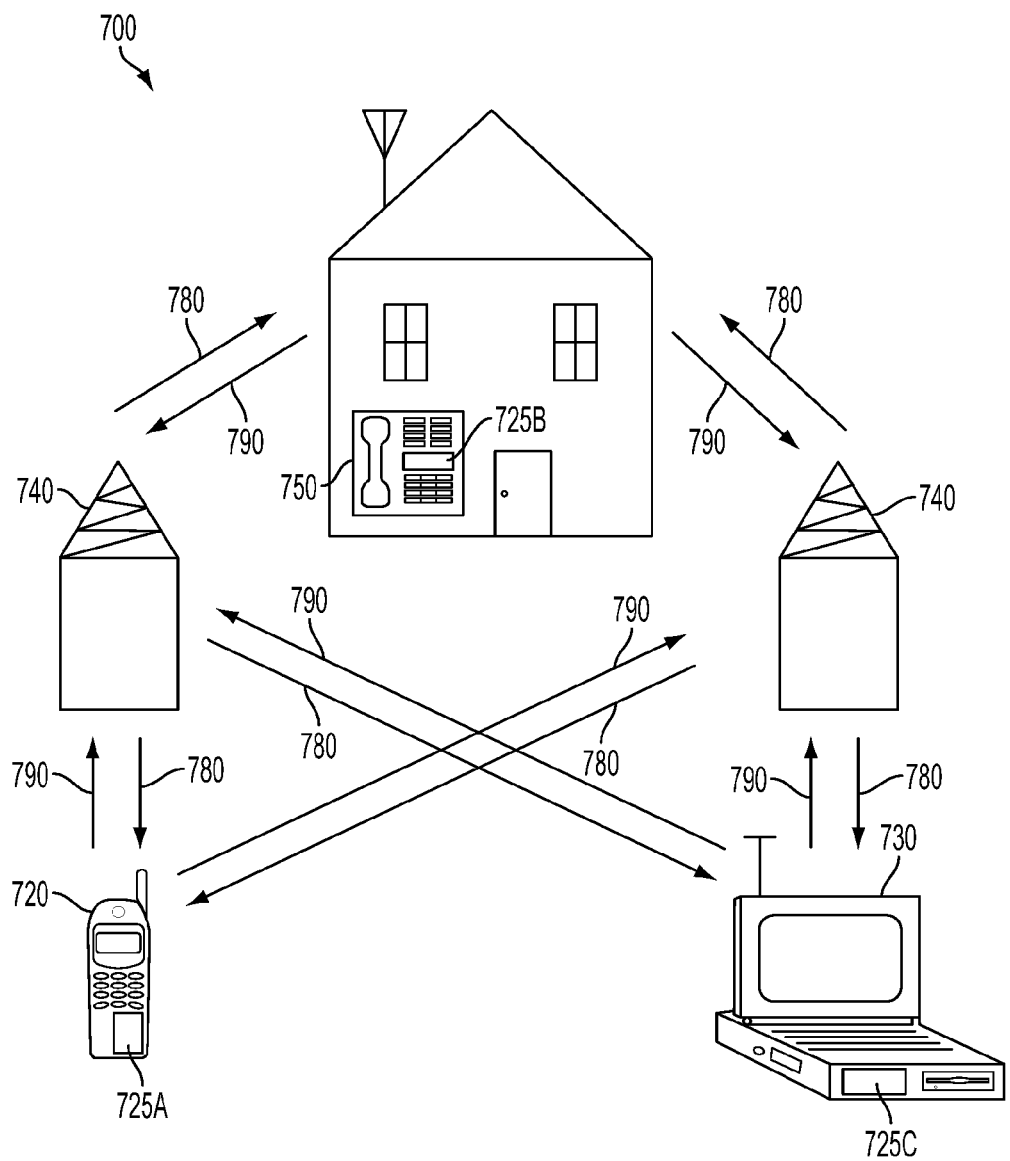
FIG. 7 is a block diagram showing an exemplary wireless communication system in which a configuration of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C, and 725B that include the disclosed 3D multiplexer structures. It will be recognized that other devices may also include the disclosed 3D multiplexer structures, such as the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 7 illustrates remote units according to the aspects of the disclosure, the disclosure is not limited to these exemplary illustrated units. Aspects of the disclosure may be suitably employed in many devices, which include the disclosed 3D multiplexer structures.

Figure 8:
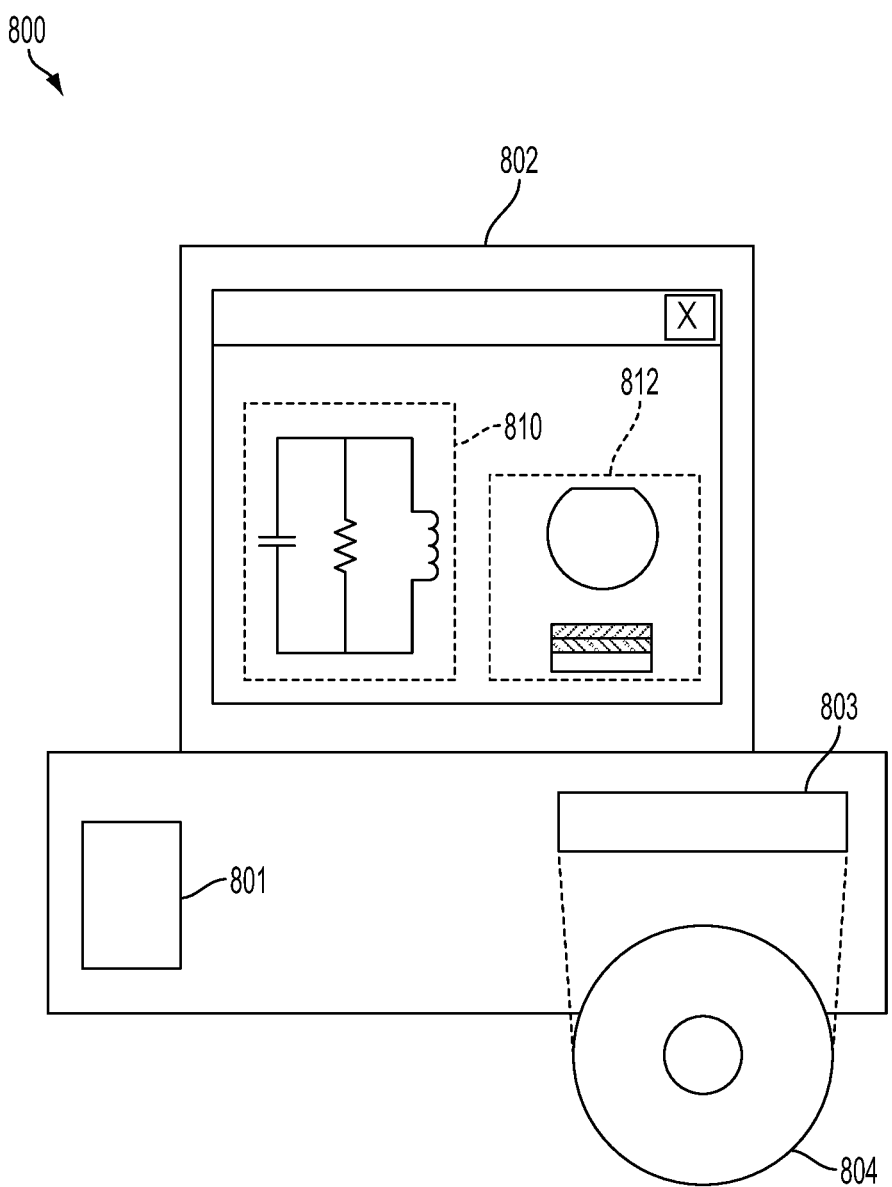
FIG. 8 is a block diagram illustrating a design workstation used for circuit, layout, and logic design of a semiconductor component according to one configuration.

FIG. 8 is a block diagram illustrating a design workstation used for circuit, layout, and logic design of a semiconductor component, such as the multiplexer structures disclosed above. A design workstation 800 includes a hard disk 801 containing operating system software, support files, and design software such as Cadence or OrCAD. The design workstation 800 also includes a display 802 to facilitate design of a circuit 810 or a semiconductor component 812 such as a 3D multiplexer structure. A storage medium 804 is provided for tangibly storing the circuit design 810 or the semiconductor component 812. The circuit design 810 or the semiconductor component 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit design 810 or the semiconductor component 812 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A three dimensional (3D) stacked multiplexer structure, comprising:
   a high band filter comprising a first two dimensional (2D) inductor capacitor (LC) filter circuit including a first 2D spiral inductor and at least one first capacitor, the high band filter on a first side of the 3D stacked multiplexer structure; and
   a low band filter comprising a second 2D LC filter circuit including a second 2D spiral inductor and at least one second capacitor, the second 2D LC filter circuit stacked directly on and communicably coupled to the first 2D LC filter circuit, the low band filter on a second side opposite the first side of the 3D stacked multiplexer structure and opposite from the high band filter.

2. The 3D stacked multiplexer structure of claim 1, in which the second 2D spiral inductor comprises a copper trace.

3. The 3D stacked multiplexer structure of claim 1, further comprising a mid-band filter coupled to conductive bumps of the high band filter.

4. The 3D stacked multiplexer structure of claim 1, in which the second side of the 3D stacked multiplexer structure, including the low band filter, is a backside of the 3D stacked multiplexer structure opposite from a system board.

5. The 3D stacked multiplexer structure of claim 1, in which the first 2D LC filter circuit and the second 2D LC filter circuit are stacked to arrange the first 2D spiral inductor opposite from the second 2D spiral inductor.

6. The 3D stacked multiplexer structure of claim 1, in which the first 2D LC filter circuit and the second 2D LC filter circuit are stacked back to back, back to face, face to back, or face to face.

7. The 3D stacked multiplexer structure of claim 1, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

8. A method of constructing a three dimensional (3D) stacked multiplexer structure, comprising:
   fabricating a first two dimensional (2D) inductor capacitor (LC) filter circuit, including a first 2D spiral inductor and at least one first capacitor, on a passive substrate panel;

fabricating a second LC filter circuit, including a second 2D spiral inductor and at least one second capacitor, on the passive substrate panel;

removing the passive substrate panel from the first 2D LC filter circuit and the second 2D LC filter circuit; and stacking the second 2D LC filter circuit directly on the first 2D LC filter circuit.

9. The method of claim 8, in which the first 2D LC filter circuit is fabricated directly on a first surface of the passive substrate panel and the second 2D LC filter circuit is fabricated directly on a second surface of the passive substrate panel opposite the first surface using a dual-sided printing process.

10. The method of claim 8, in which the first 2D LC filter circuit is fabricated side by side with the second 2D LC filter circuit directly on a surface of the passive substrate panel.

11. The method of claim 10, in which stacking the second 2D LC filter circuit directly on the first 2D LC filter circuit comprises:

peeling the passive substrate panel from the first 2D LC filter circuit fabricated side by side with the second 2D LC filter circuit; and folding a backside of the second 2D LC filter circuit onto the backside of the first 2D LC filter circuit according to a back to back integration of the first 2D LC filter circuit and the second 2D LC filter circuit.

12. The method of claim 8, in which removing the substrate comprises using an etching process or a mechanical peeling process to remove the first 2D LC filter circuit and the second 2D LC filter circuit.

13. The method of claim 8, in which the first 2D LC filter circuit is fabricated using a first process and the second 2D LC filter circuit is fabricated using a second process different from the first process.

14. The method of claim 8, further comprising integrating the 3D stacked multiplexer structure into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

15. A three dimensional (3D) stacked multiplexer structure, comprising:

a high band filter comprising a first two dimensional (2D) inductor capacitor (LC) filter circuit including a 2D spiral inductor and at least one first means for storing charge, the high band filter on a first side of the 3D stacked multiplexer structure; and a low band filter comprising a second 2D LC filter circuit including a second 2D spiral inductor and at least one second means for storing charge, the second 2D LC filter circuit stacked directly on and communicably coupled to the first 2D LC filter circuit, the low band filter on a second side opposite the first side of the 3D stacked multiplexer structure and opposite from the high band filter.

16. The 3D stacked multiplexer structure of claim 15, further comprising a mid-band filter coupled to conductive bumps of the high band filter.

17. The 3D stacked multiplexer structure of claim 15, in which the second side of the 3D stacked multiplexer structure including the low band filter is a backside of the 3D stacked multiplexer structure that is opposite from a system board.

18. The 3D stacked multiplexer structure of claim 15, in which the first 2D LC filter circuit and the second 2D LC filter circuit are stacked to arrange the first 2D spiral inductor opposite from the second 2D spiral inductor.

19. The 3D stacked multiplexer structure of claim 15, in which the first 2D LC filter circuit and the second 2D LC filter circuit are stacked back to back, back to face, face to back, or face to face.

20. The 3D stacked multiplexer structure of claim 15, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

21. A radio frequency (RF) front end module, comprising:

a three dimensional (3D) stacked multiplexer structure, including a high band filter comprising a first two dimensional (2D) inductor capacitor (LC) filter circuit including a first 2D spiral inductor and at least one first capacitor, the high band filter on a first side of the 3D stacked multiplexer structure, and a low band filter comprising a second 2D LC filter circuit including a second 2D spiral inductor and at least one second capacitor, the second 2D LC filter circuit stacked directly on and communicably coupled to the first 2D LC filter circuit, the low band filter on a second side opposite the first side of the 3D stacked multiplexer structure and opposite from the high band filter; and an antenna coupled to an output of the 3D stacked multiplexer structure.

22. The RF front end module of claim 21, further comprising:

a high band antenna switch coupled to the first 2D LC filter circuit through a high band input port of the 3D stacked multiplexer structure; and a low band antenna switch coupled to the second 2D LC filter circuit through a low band input port of the 3D stacked multiplexer structure.

23. The RF front end module of claim 21, further comprising a mid-band filter coupled to conductive bumps of the high band filter.

24. The RF front end module of claim 21, incorporated into at least one of a music player, a video player, an entertainment unit, a navigation device, a communications device, a personal digital assistant (PDA), a fixed location data unit, a mobile phone, and a portable computer.

* * * * *